(12) United States Patent
Krassnitzer et al.

(10) Patent No.: US 11,306,390 B2
(45) Date of Patent: Apr. 19, 2022

(54) ARC SOURCE

(71) Applicant: Oerlikon Surface Solutions AG, Pfäffikon, Pfäffikon (CH)

(72) Inventors: Siegfried Krassnitzer, Feldkirch (AT); Juerg Hagmann, Sax (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 16/753,734

(22) PCT Filed: Oct. 4, 2018

(86) PCT No.: PCT/EP2018/000460
§ 371 (c)(1),
(2) Date: Apr. 3, 2020

(87) PCT Pub. No.: WO2019/081053
PCT Pub. Date: May 2, 2019

(65) Prior Publication Data
US 2020/0255932 A1 Aug. 13, 2020

Related U.S. Application Data

(60) Provisional application No. 62/567,423, filed on Oct. 3, 2017.

(51) Int. Cl.
*H01J 37/32* (2006.01)
*C23C 14/32* (2006.01)
(Continued)

(52) U.S. Cl.
CPC ........ *C23C 14/325* (2013.01); *C23C 14/0641* (2013.01); *C23C 14/243* (2013.01);
(Continued)

(58) Field of Classification Search
None
See application file for complete search history.

(56) References Cited

U.S. PATENT DOCUMENTS

| 4,448,659 A | * | 5/1984 | Morrison, Jr. | .... H01J 37/32055 |
| | | | | 204/192.38 |
| 4,724,058 A | * | 2/1988 | Morrison, Jr. | ........ C23C 14/325 |
| | | | | 204/192.38 |

(Continued)

FOREIGN PATENT DOCUMENTS

| CN | 101358328 A | 2/2009 |
| RU | 2482217 C1 | 5/2013 |
| WO | 2011021281 A1 | 2/2011 |

*Primary Examiner* — Jason Berman (57) ABSTRACT

An ARC evaporator comprising: —a cathode assembly, —an electrode arranged for enabling that an arc between an electrode and a front surface of the target can be established, and—a magnetic guidance system placed in front of a back surface of the target characterized in that: the magnetic guidance system comprises means placed in a central region for generating at least one magnetic field and means in a peripherical region for generating at least one further magnetic field, wherein the magnetic fields generated in this manner result in a total magnetic field for guiding the arc and controlling the cathode spot path at the front surface of the target, wherein the means placed in the central region comprises one electromagnetic coil for generating a magnetic field and the means placed in the peripherical region comprises two electromagnetic coils for generating two further magnetic fields.

15 Claims, 11 Drawing Sheets

(51) Int. Cl.
*C23C 14/06* (2006.01)
*C23C 14/24* (2006.01)
*C23C 14/54* (2006.01)

(52) U.S. Cl.
CPC ........ *C23C 14/54* (2013.01); *H01J 37/32055* (2013.01); *H01J 37/3255* (2013.01); *H01J 37/3266* (2013.01); *H01J 37/32541* (2013.01); *H01J 37/32559* (2013.01); *H01J 37/32669* (2013.01); *H01J 2237/152* (2013.01); *H01J 2237/332* (2013.01)

(56) References Cited

U.S. PATENT DOCUMENTS

| | | | |
|---|---|---|---|
| 5,298,136 A * | 3/1994 | Ramalingam | H01J 37/32055 204/192.38 |
| 2004/0055538 A1* | 3/2004 | Gorokhovsky | C23C 14/0641 118/715 |
| 2004/0154919 A1 | 8/2004 | Curtins | |
| 2009/0050059 A1 | 2/2009 | Goikoetxea Larrinaga | |
| 2011/0315544 A1* | 12/2011 | Goikoetxea Larrinaga | C23C 14/325 204/192.38 |
| 2013/0032469 A1* | 2/2013 | Warzyszynski | H01J 37/32055 204/192.38 |

* cited by examiner

Magnetic field in axisymmetric configuration scope of magnet adjustability

| unipolar | bipolar | focused |
|---|---|---|
|  |  |  |

ARC SOURCE

The present invention relates to a new ARC source comprising a variable magnetic field.

The inventive ARC source comprises a cathode material to be vaporized in order to produce coating material for depositing a coating film on a substrate surface to be coated and means for producing a spatiotemporal variable magnetic field for controlling the arc trajectory during coating process. The invention also relates to an apparatus equipped with inventive ARC sources and methods for using the inventive ARC sources.

Hereafter also the term target will be used for referring to the cathode material to be vaporized.

In the context of the present invention the term ARC source is used for referring to an arc evaporator comprising a target to be operated as cathode material to be evaporated by effect of an arc discharge.

TECHNICAL FIELD OF THE INVENTION

The present invention belongs to the field of arc evaporators and, more specifically, to the field of arc evaporators including means for causing a guidance of the arc trajectory by generation of a magnetic field.

STATE OF THE ART

The arc evaporator machines usually comprise, in addition to the chamber itself, at least one electrode and one cathode between which an electric arc is established. To prevent or reduce the random nature of the movement of the arc for the purpose of controlling erosion of the cathode surface being evaporated and reducing droplets formation, control or magnetic guidance systems for controlling the movement of the arc have been developed. These guidance systems form and modify magnetic fields affecting the movements of the electric arc. There are several publications of patents or patent applications that describe different systems of this type.

Goikoetxea Larrinaga describes for example an arc evaporator including a magnetic guidance system in the U.S. patent application publication No. 2009/0050059. In this document it is explained the magnetic guidance system is designed for allowing control of the cathode arc and for moving the cathode arc over a broad area of the cathode plate. More specifically, the magnetic guidance system should allow guidance of the cathode point (also referred to as cathode spot). The cathode point should be understood as the point of impact of the arc on the cathode. By using the magnetic guidance system, the cathode point should be guided according to a path chosen individually from among a practically infinite number of possible paths. The magnetic guidance system is designed to be placed completely outside the evaporation chamber. This arc evaporator comprises an evaporation target (a circular evaporator target with a diameter of 100 mm) used as cathode element, a ferromagnetic core designed forming a support and a magnetic device for generating magnetic fields. The magnetic device comprises a central pole and a peripheral pole, as well means for generating a first magnetic field and means for generating a second magnetic field, so that respective magnetic field components contribute to a total magnetic field in correspondence with the cathode element.

DISADVANTAGES OF THE STATE OF THE ART

Using currently available ARC sources (i.e. arc evaporators) involves the disadvantage that the flexibility for adjusting magnetic fields generated for guiding the arc trajectory and consequently for controlling the cathode spot path at the target surface in an ARC source is insufficient for allowing spatiotemporal changes of the magnetic fields resulting in more exact adjustment of subsequent different paths of the cathode spot during operation of the same ARC source during a coating process.

OBJECTIVE OF THE PRESENT INVENTION

In view of the above-mentioned deficiencies of ARC sources according to the state of the art, the main objective of the present invention is to provide a new ARC source with an alternative configuration that allows generating magnetic fields that are not only variable at will regarding local properties of the generated magnetic field but also adjustable at will regarding adjustment of frequency of changes of local (spatial) properties of the generated magnetic field.

DESCRIPTION OF THE PRESENT INVENTION

In order to attain the above-mentioned objective, the inventors propose a new ARC source according to the present invention that is designed for allowing high flexibility regarding magnetic field configuration. It means in particular in the context of the present invention that the spatial distribution and field strength is designed so that it can be adjusted independently. In this manner it is possible to obtain a high flexibility regarding high scope of magnet adjustability for the magnetic field in axisymmetric configuration.

Figure 5:
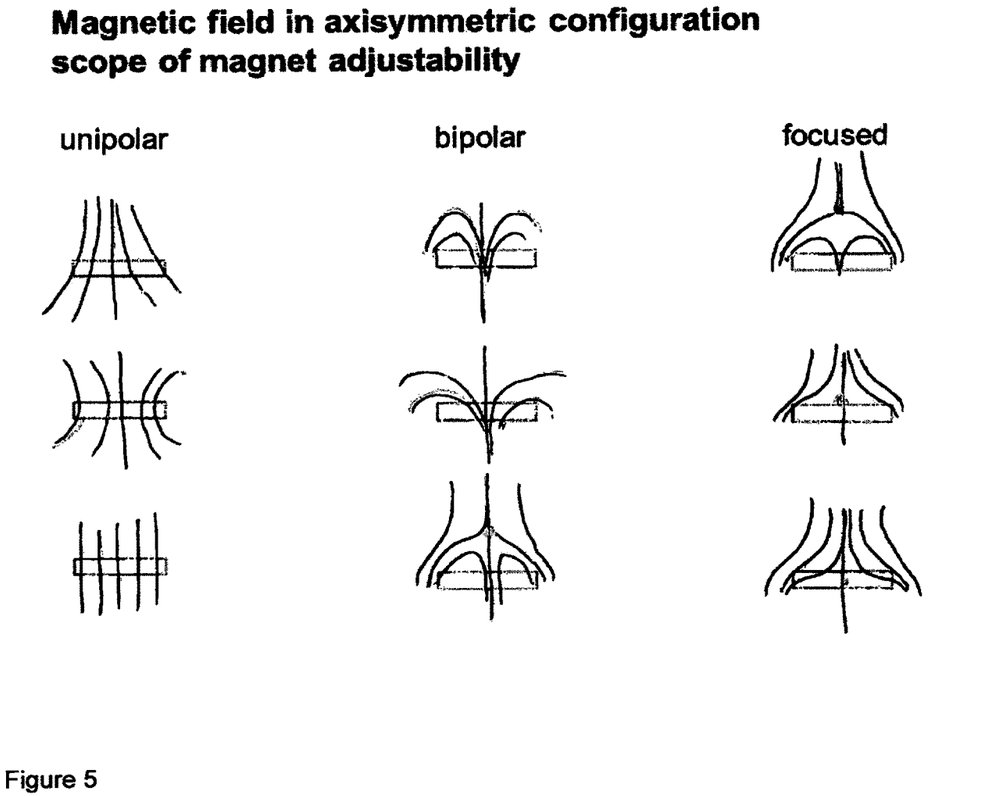
FIG. 5 shows different magnetic fields in axisymmetric configuration scope that can be adjusted with magnet configurations.

FIG. 5 shows different magnetic fields in axisymmetric configuration scope that can be adjusted with magnet configurations.

Concretely, the ARC source (arc evaporator) according to the present invention comprises:
- a cathode assembly comprising a cooling plate 11, a target 1 as cathode element, preferably a disc-shaped target but can be also for example a rectangular target, the target 1 having a thickness in the cross direction, a front surface 1A disposed to be evaporated and a back surface 1B, the front surface 1A being parallel to the back surface 1B, these both surfaces being separated one of each other by the thickness of the target 1, the cathode assembly having a total height in the transversal direction and borders delimiting the total amplitude in any longitudinal direction,
- an electrode (not shown in FIGS. 6a and 6b) arranged in known manner for enabling that an arc between the electrode and the front surface 1A of the target 1 can be established for causing evaporation of at least part of the front surface of the target 1, and
- a magnetic guidance system placed in front of the back surface 1B of the target 1 comprising means for generating one or more magnetic fields resulting in a total magnetic field comprising magnetic field lines which extend through the cross section of the target 1 and along the space in front of the front surface 1A of the target 1 for guiding a cathode spot that results from the contact of an arc to the target 1, when the arc is established between the electrode and the front surface 1A of the target 1, the magnetic guidance system in the ARC source comprising means placed in a central region for generating at least one magnetic field and means in a peripherical region for generating at least one further magnetic field, wherein the magnetic fields generated in this manner result in a total magnetic field for guiding the arc and controlling the cathode spot path at the front surface 1A of the target, wherein:
the means comprises one electromagnetic coil C3 in the central region for generating a magnetic field and two electromagnetic coils C1 and C2 in the peripherical region for generating two further magnetic fields.

Further Description of Magnetic Field Generation, in Particular by Using a Magnet System (Also Referred to as Magnetic Guidance System) with 3 Electromagnetic Coils According to the Present Invention:

According to a preferred variant of the preferred embodiment mentioned directly above, the magnet system is made only of electromagnetic coils (hereafter this magnet system will be also referred to as coil system).

By using a magnetic guidance system in the ARC source comprising means placed in a central region for generating at least one magnetic field and means in a peripherical region for generating at least one further magnetic field, the magnetic fields generated in this manner result in a total magnetic field for guiding the arc and controlling the cathode spot path at the front surface 1A of the target. In this regard, FIG. 6a shows schematically a possible arrangement of means for generation of magnetic fields in the magnetic guidance system corresponding to a preferred embodiment of an ARC source according to the present invention. In this preferred embodiment, the means comprises one electromagnetic coil C3 in the central region for generating a magnetic field and two electromagnetic coils C1 and C2 in the peripherical region for generating two further magnetic fields.

Both FIG. 6a and FIG. 6b show outlined inventive ARC sources 2 according to the directly above-mentioned variant. In this variant, two electromagnetic coils, C1 and C2 are used for acting as an outer (peripheral) magnet ring. These two coils, C1 and C2, should be arranged in such a manner that each one can countervail each other. These two coils, C1 and C2, can for example be polarized antiparallel. The relation of C1 to C2 (C1/C2) determines the magnetic focus. The coil system of this variant of an inventive ARC source comprises furthermore a third coil C3 placed in the center area (central region), which has influence on the center of the target and on the magnitude of the magnetic field strength. This coil system can produce the same magnetic field than an equivalent permanent magnet setup and involves the big advantage that the magnetic field strength can be modified without any magnet movement.

Preferably, the inventive ARC source comprises a magnet system comprising electromagnetic coils and soft magnetic materials (also referred to as ferromagnetic material). For this preferred embodiment pure iron is a very suitable soft magnetic material. Also, low carbon steel is suitable as soft magnetic material and even the below-mentioned types of ferromagnetic material are suitable as soft magnetic material for this preferred embodiment.

Ferromagnetic materials are soft iron materials having high saturation and low remanence. In the context of the present invention some ferromagnetic materials that can be preferably used are pure iron, ARMCO pure iron, construction steel e.g. S235JR or S355J2, martensitic chromium steel e.g. 1.4021. More preferably construction steel S355J2 can be used.

According to a preferred embodiment of the present invention, the electromagnetic coils C1, C2 and C3 are surrounded by soft magnetic material 20 as it is shown in FIG. 6a.

According to a further preferred embodiment of the present invention, the magnetic guidance system comprises ferromagnetic material 20 disposed surrounding (or in other words encircling) the means for generation of magnetic field as it is exemplarily shown in FIG. 6a. It can be noted that the ferromagnetic material 20 is distributed encircling the means but no ferromagnetic material 20 is placed between the magnetic guidance system and the cathode assembly. The electromagnetic coils C1, C2 and C3 are surrounded by soft magnetic material.

FIG. 6b shows schematically a further preferred embodiment of the present invention in which the ferromagnetic material 20 is not completely encircling the means for generating the magnetic fields. In this preferred embodiment an upper part with length S of an electromagnetic coil (in this example C3) placed in the central region as well as an upper part with length S' of the electromagnetic coil (in this example C2) placed in the peripherical region but closest to the electromagnetic coil placed in the central region is not encircled by ferromagnetic material 20, resulting in a space Spc comprising air, allowing in this manner that the total magnetic field that results from the sum of the generated magnetic fields exhibits more magnetic field lines that are parallel to the front surface 1A of the target 1 in comparison with a similar arc evaporator without having said space Spc comprising air. By using this preferred embodiment, an upper length S in the following range: 3 mm≤S≤15 mm is recommendable when the target diameter is in the following range: 100 mm≤D1≤150 mm and the total diameter of the cathode assembly is in the following range: 150 mm≤D≤200 mm.

In relation to the above described embodiments of the present invention, it is important to take into account that:
cooling of coil setup is required and
soft magnetic material must have high saturation flux-density and low remanence.

Figure 6:
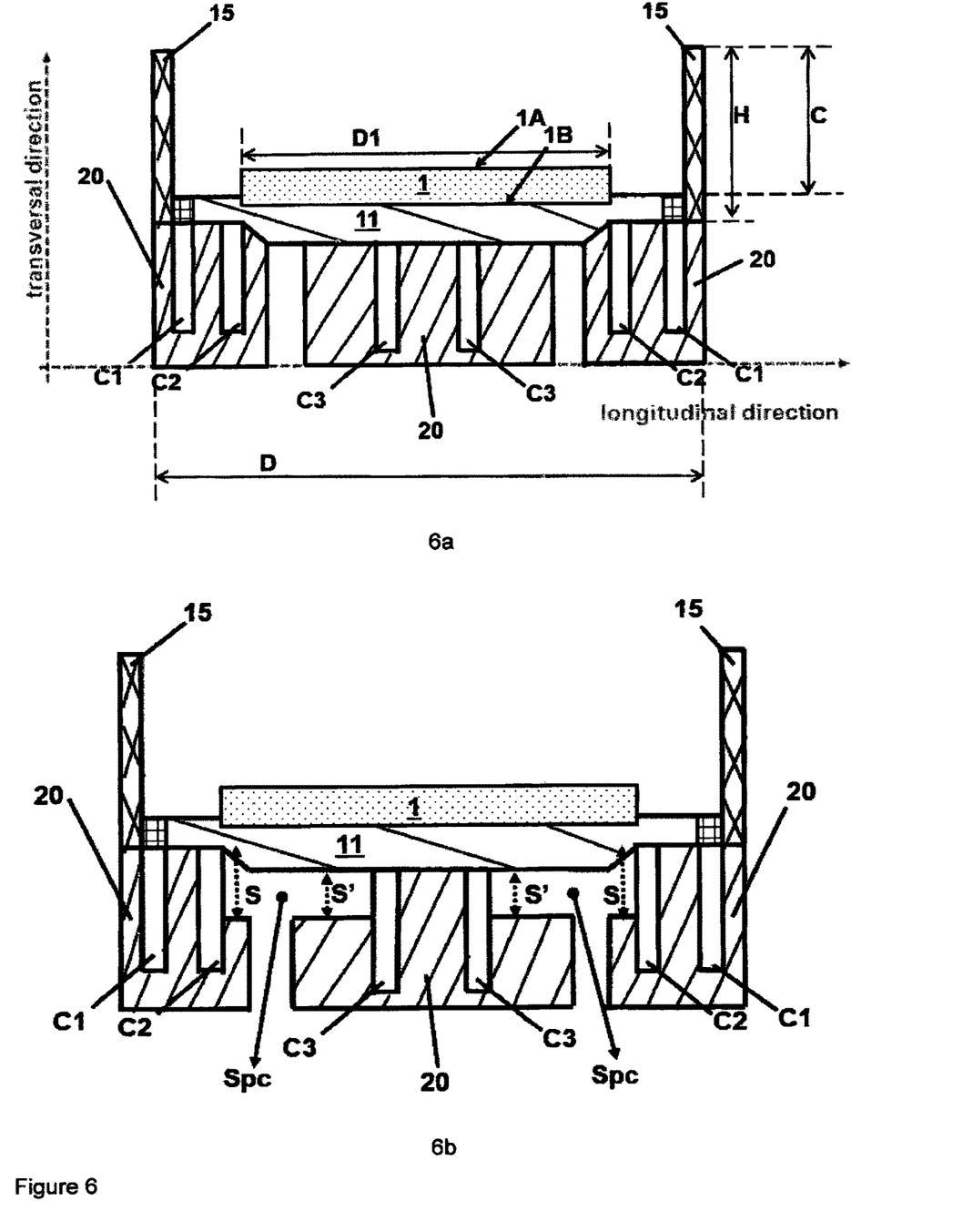
FIGS. 6a and 6b each show schematically a possible arrangement of means for generation of magnetic fields in the magnetic guidance system corresponding to a preferred embodiment of an ARC source according to the present invention.
Figures 7, 7A, 7B:
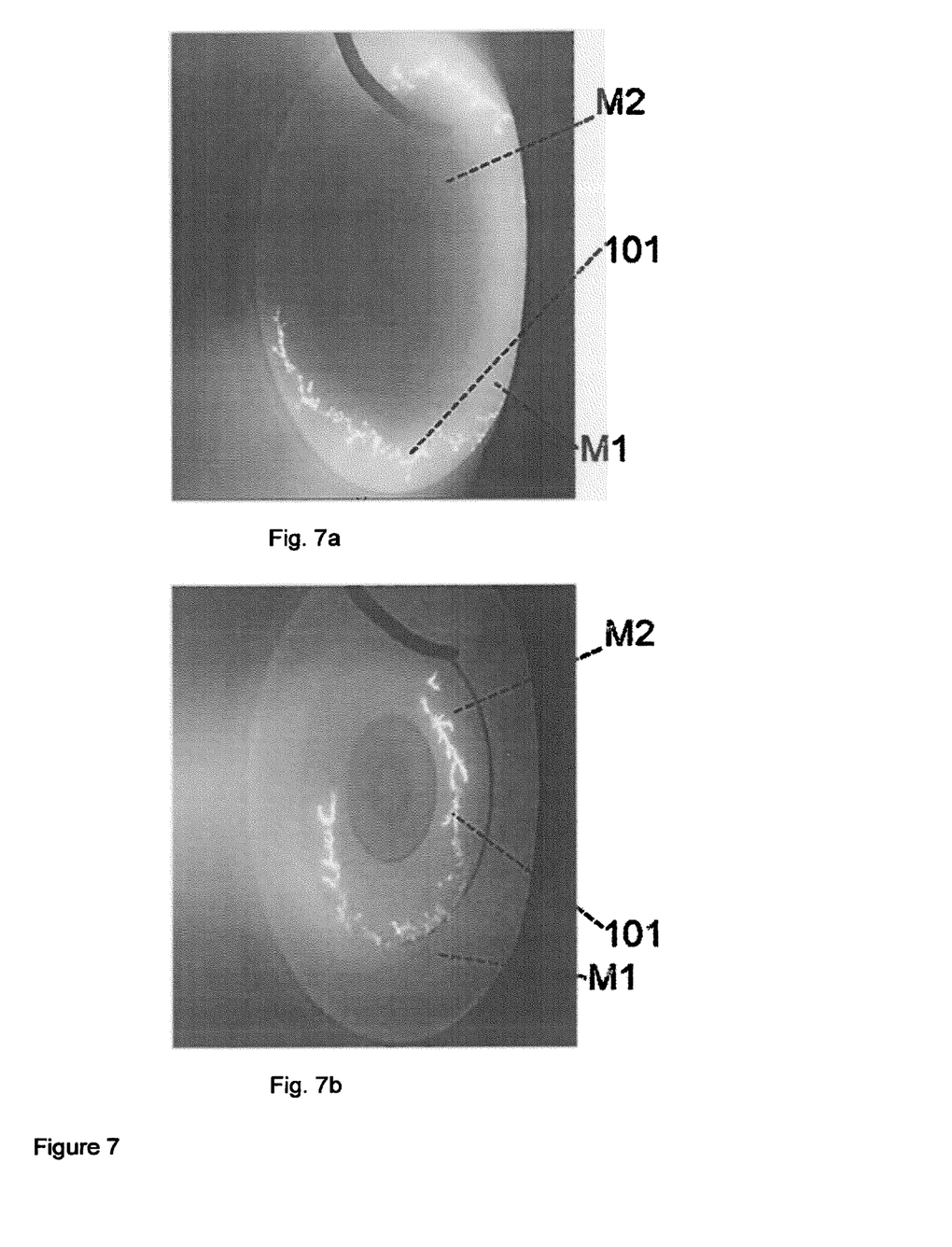
FIG. 7a shows a circular arc trace having a larger diameter, which allows vaporizing target material being comprised in the areas of the target surface which are near to target borders.
FIG. 7b shows a circular arc trace having a smaller diameter, which allows vaporizing target material being comprised in the areas of the target surface which are near to center of the target.

Variation of Magnetic Field Geometries by Changing the Currents and Polarities of the Coil System with 3 Electromagnetic Coils According to the Present Invention:

By adjusting the coil system with three electromagnetic coils arranged as shown in FIG. 6, it is possible to oscillate the magnetic field by adjusting an oscillation frequency in such a manner that arcs are guided for running at the target surface describing circular arc traces having different diameters, as it is shown exemplarily in FIG. 7a-b.

FIG. 7a shows a circular arc trace having a larger diameter, which allows vaporizing target material being comprised in the areas of the target surface which are near to target borders. FIG. 7b shows a circular arc trace having a smaller diameter, which allows vaporizing target material being comprised in the areas of the target surface which are near to center of the target. In the examples shown in FIG. 7a-b aluminum was used as a first material M1, forming the outer annular area of the target to be vaporized, and titanium was used a second material M2, forming the inner area of the target to be vaporized.

According to a preferred embodiment of the present invention the ARC source comprises a coil system with 3 electromagnetic coils as mentioned above target and a circular target comprising at least two materials distributed in such a manner, that by changing the diameter of the circular arc being operated at the target surface, the target material that is being vaporized is changed.

Figure 8:
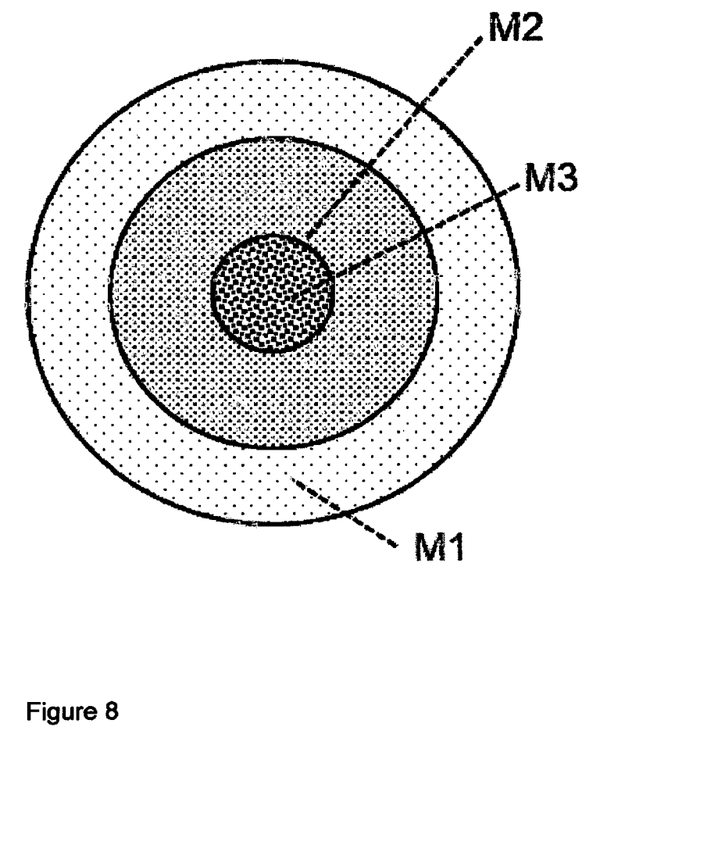
FIG. 8 shows illustratively a circular target formed of three different materials, M1, M2 and M3.

FIG. 8 shows illustratively a circular target formed of three different materials, M1, M2 and M3. The first material M1 is arranged, forming the outer annular area of the target that comprises the target borders, the third material M3 is arranged, forming the circle comprising the center of the target, and the second material M2 is arranged, forming the annular area of the target that is between the central area formed of the third material M3 and the outer area formed of the first material M1.

In order to vaporize the two or three or more materials comprised in the inventive targets forming two or three or more annular portions or annular portions and circular portions, the inventors propose to oscillate the magnetic field in order to guide the arc for running at the target surface describing circular arc traces having diameters which allows vaporizing each material comprised in each annular portion or circular portion of the target according to the desired composition and architecture of the coating being deposited.

The above-mentioned preferred embodiments of the present invention can be operated for example by varying the oscillation frequency.

For example, no changes in the coating deposition conditions will be produced by adjusting an oscillation frequency of 0 Hz, at least during part of the coating deposition. In such a case it is possible to deposit a coating layer exhibiting constant coating properties. So one can deposit one layer comprised in a coating system, comprising more than one layer, or one can also deposit a monolayer coating.

Otherwise, by adjusting an oscillation frequency higher than 0 Hz (>0 Hz) it is possible to deposit a multilayer coating having an architecture comprising different individual layers which are repeated in the architecture periodically, each individual layer having a predetermined layer thickness inclusively a thickness in nanometer range, which makes possible to produce nanolayer coatings and multi-nanolayer coatings By using the three coils C1, C2 and C3 according to the present invention, it was possible to adjust oscillation frequencies up to 50 Hz, i.e. corresponding to values between 0 and 50 Hz.

According to a preferred use of an ARC source according to the present invention, the ARC source is operated by adjusting the oscillation frequency to have a value of 0.1 Hz or higher, e.g. between 0.1 Hz and 10 Hz or between 0.1 Hz and 50 Hz.

According to a further preferred use of an ARC source according to the present invention, the ARC source is operated by adjusting the oscillation frequency to have a value of 10 Hz or higher, e.g. between 10 Hz and and 50 Hz.

By operating the inventive ARC sources in this manner it is possible to oscillate between different magnetic field geometries.

Particular Advantages Associated to this Kind of Operation of the Inventive ARC Sources are:
Attaining mix of oscillation plasma properties, which can be used for producing coatings having an architecture exhibiting a variable structure. For example, a multi-layer structure with layers having different compositions and different layer thicknesses.
Attaining improved control over target erosion by better control of the desired cathode paths.
Avoiding carving of arc spot into the target, especially when non-reactive coating processes are conducted by using targets made of metals or in general when targets made of materials with few numbers of arc spots (e.g. metals or carbon) are used.
Producing nanolayer structures by using the same ARC source.

Furthermore, in order to allow placing ARC sources forming a denser packing arrangement for improving efficiency, the ARC source (arc evaporator) according to the present invention can comprise a surrounding shield 15, wherein the borders of the cathode assembly comprise a surrounding shield 15 made of ferromagnetic material, wherein the surrounding shield 15 has a total height H in the transversal direction, said total height H including a component C for causing a shielding effect of magnetic field lines extending in any longitudinal directions, establishing in this manner the borders of the cathode assembly as limit of the extension of the magnetic field lines in any longitudinal direction.

For selecting an appropriate component C of the total height H of the surrounding shield 15, the dimensions of the cathode assembly must be considered.

For example, in the case that the cathode assembly has a symmetrical construction comprising a disc-shaped target with target diameter D1 and the cathode assembly has a total diameter D as it is the case in the example shown schematically in FIG. 6a, then a recommendable value for the component C of the total height H of the surrounding shield 15 can be in the following range: D/20≤C≤D/5.

According to a preferred embodiment of the present invention the target diameter is in the following range: 100 mm≤D1≤150 mm, the total diameter of the cathode assembly is in the following range: 150 mm≤D≤200 mm.

Figure 9:
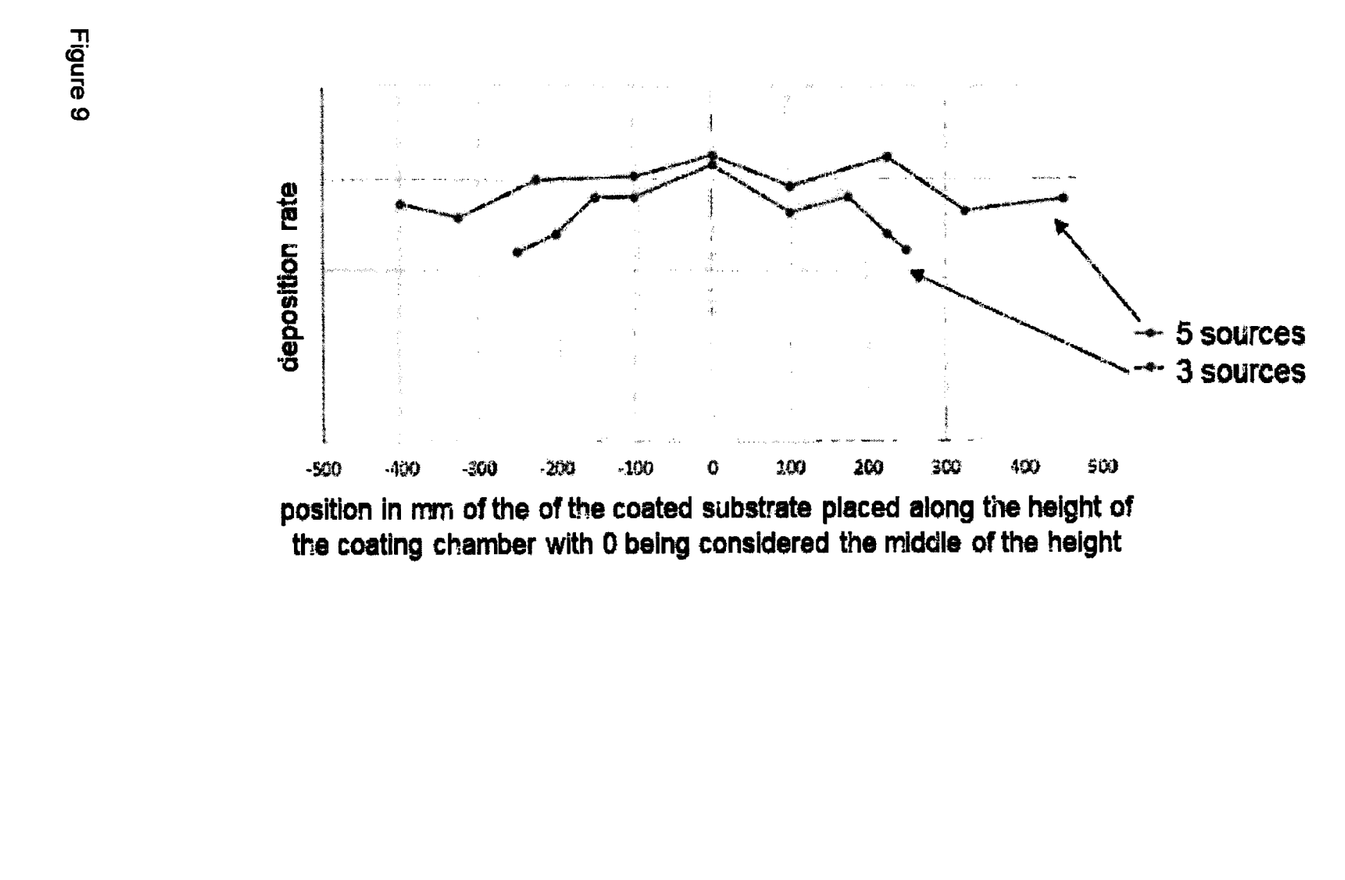
FIG. 9 shows the high uniformity regarding deposition rate (in arbitrary units) of AlTiN coatings deposited by using 5 inventive ARC sources distributed in a denser packing distribution along the height of a wall of a coating chamber in comparison with using 3 inventive ARC sources distributed along the height of the same wall of the same coating chamber.

FIG. 9 shows the high uniformity regarding deposition rate (in arbitrary units) of AlTiN coatings deposited by using 5 inventive ARC sources distributed in a denser packing distribution along the height of a wall of a coating chamber in comparison with using 3 inventive ARC sources distributed along the height of the same wall of the same coating chamber. Same coating parameters where used in both cases in order to make possible the comparison. It can be observed that a high uniformity can be attained in both cases, but especially higher uniformity (i.e. lower non-uniformity of <±10%) was attained by using a higher quantity of ARC sources, in this case by using 5 ARC sources.

Figure 10:
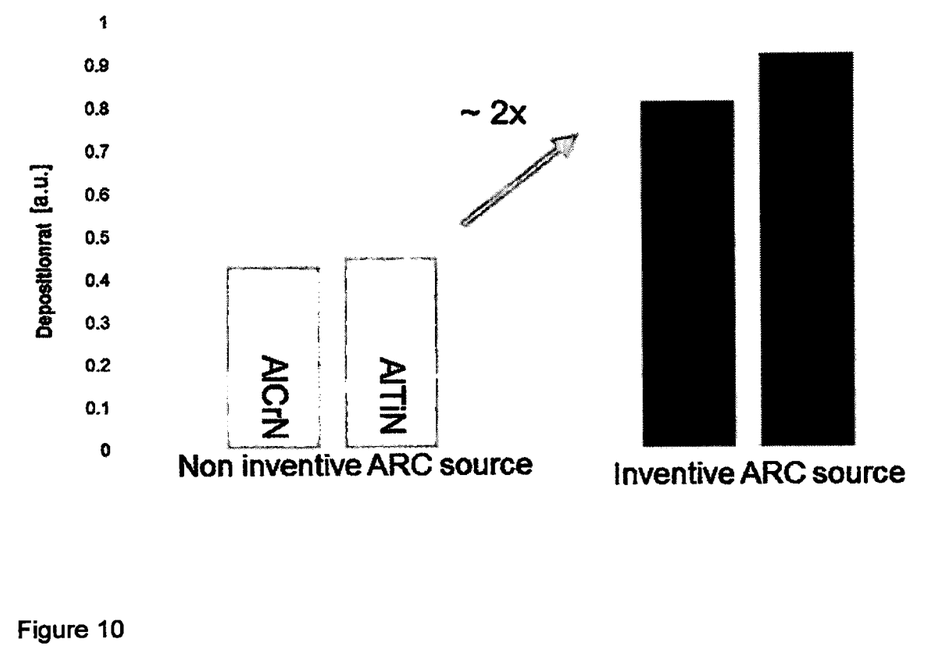
FIG. 10 shows a comparison between deposition rates (in arbitrary units), by using a coating arrangement comprising non-inventive ARC sources and by using a coating arrangement comprising inventive ARC sources.

FIG. 10 shows a comparison between deposition rates (in arbitrary units), by using a coating arrangement comprising non-inventive ARC sources and by using a coating arrangement comprising inventive ARC sources. The rate was considered per coating line. An increment of the deposition rate by a factor of approximately 2 was attained by using the arrangement with the inventive ARC sources.

Figure 11:
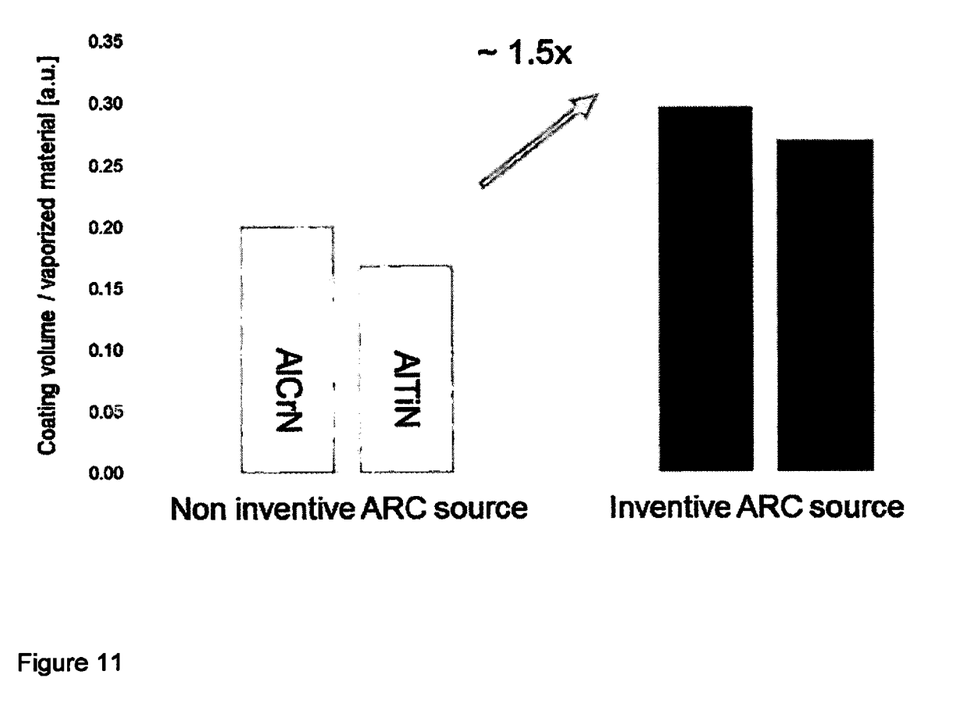
FIG. 11 shows a comparison between coating efficiency calculated regarding coating volume/vaporized material, by using a coating arrangement comprising non-inventive ARC sources and by using a coating arrangement comprising inventive ARC sources.

FIG. 11 shows a comparison between coating efficiency calculated regarding coating volume/vaporized material, by using a coating arrangement comprising non-inventive ARC sources and by using a coating arrangement comprising inventive ARC sources. An increment of approximately 50% in the utilization of material vaporized from the target was attained by using the arrangement with the inventive ARC sources. It means that from the material vaporized from the target, approximately 50% more was deposited in the substrate surface to be coated by using the inventive ARC sources.

The results shown in FIGS. 10:
For the non-inventive examples: 2 non-inventive ARC sources, each one comprising a target having diameter of 150 mm and being operated by using an arc current of 150 A, the 2 non-inventive ARC sources being arranged along a height of the wall of the coating chamber of 400 mm.
For the inventive examples: 3 inventive ARC sources, each one comprising a target having diameter of 150 mm and being operated by using an arc current of 150 A, the 3 inventive ARC sources being arranged along a height of the wall of the coating chamber of 500 mm.

Since 3 inventive ARC sources were used instead of 2 non-inventive ARC sources, it was expected and increment of 1,5 times in the deposition rate, however, the increment was considerably higher because it was of about 2 times. These results provide evidence of the considerable advantage in efficiency that can be attained by using ARC sources according to the present invention.

The results shown in FIGS. 11:
For the non-inventive examples: 2 non-inventive ARC sources, each one comprising a target having diameter of 150 mm and being operated by using an arc current of 200 A, the 2 non-inventive ARC sources being arranged along a height of the wall of the coating chamber of 400 mm.
For the inventive examples: 3 inventive ARC sources, each one comprising a target having diameter of 150 mm and being operated by using an arc current of 200 A, the 3 inventive ARC sources being arranged along a height of the wall of the coating chamber of 500 mm.

In each case (i.e. when using non-inventive ARC sources and when using inventive ARC sources) the efficiency was determined by calculating the relation of coating volume divided by total vaporized material. For the calculation the total volume of the coating deposited on the coated substrates and the total material vaporized from the targets were determined. The total material vaporized was determined by measuring the erosion in each target after coating and adding the eroded volume corresponding to vaporized material for each respective target. An increment of about 1, 5 times was obtained by using the inventive ARC sources. These results provide evidence of the considerable advantage in efficiency that can be attained by using ARC sources according to the present invention.

By Selection of One or More Attributes for Construction of New and Innovative ARC Sources as Described Above it is Possible to Attain Respectively One or More of the Following Objectives:

In order to attain a combination of further bellow-mentioned objectives by using the same type of ARC sources:
high efficiency and productivity,
high flexibility in magnetic field variations,
working efficiently within a reactive atmosphere irrespective of reactive gas is gas ionized or low ionized, e.g. if high ionized nitrogen gas or low ionized nitrogen gas is required,
flexibility for deposition of any kind of coating e.g. nitride, oxide, carbide or combinations thereof,
reduction of operation costs by increasing overall efficiency during operation of the ARC source, in particular by:
Increasing energy efficiency,
Increasing efficiency related to maximum utilization of coating material vaporized from the cathode material,
Increasing coating film deposition rate, the inventors further propose constructing ARC sources, which can allow placing the ARC sources closer to the substrate surfaces to be coated and in a denser packing arrangement in order to improve efficiency.

In this Manner, it is Possible to Increase Efficiency for Example by:
Reducing the distance between cathode material to be vaporized and substrate surface to be coated, i.e. attaining shorter distance substrate to target.
Increasing surface of cathode material to be vaporized, by placing more cathodes, each one closer to each other within an area of a coating chamber wall comprising the cathodes to be vaporized, i.e. attaining denser packing of ARC sources.
Increasing flexibility and capability of the used magnetic means for allowing better focusing of the magnetic field, i.e. attaining more focused magnetic field.
Reducing surface of cathode material to be vaporized, in particular reducing target diameter, if circular targets are used, i.e. smaller target diameter.

Figure 1:
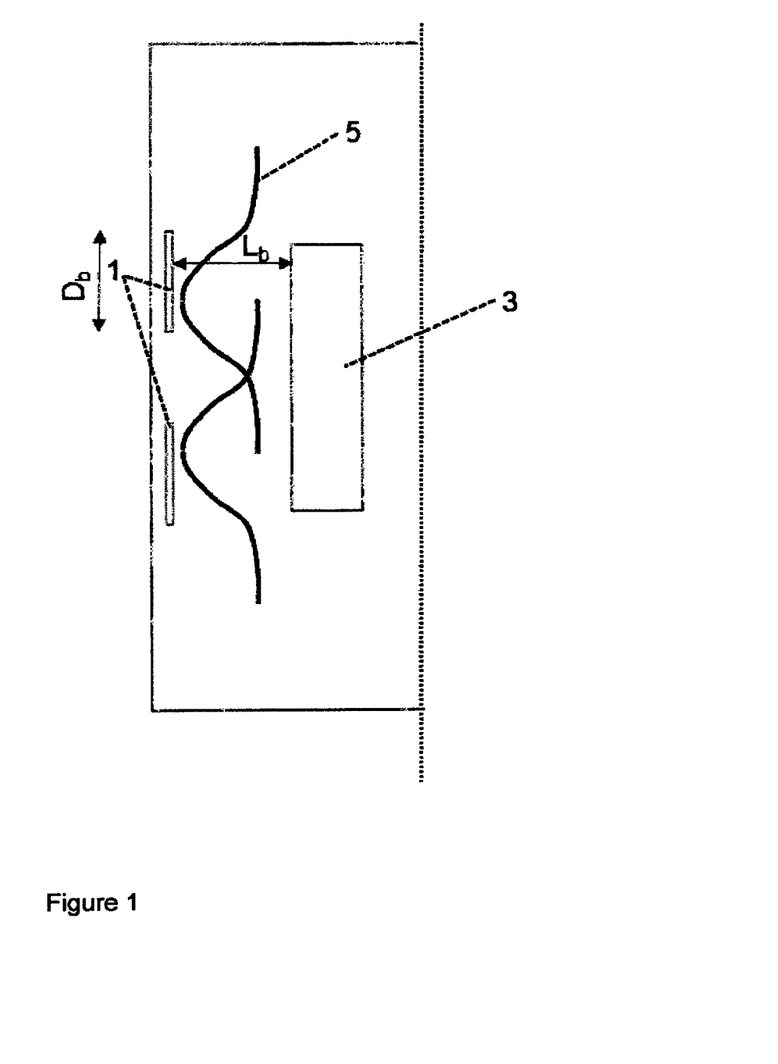
FIG. 1 shows one configuration of a coating chamber.
Figure 2:
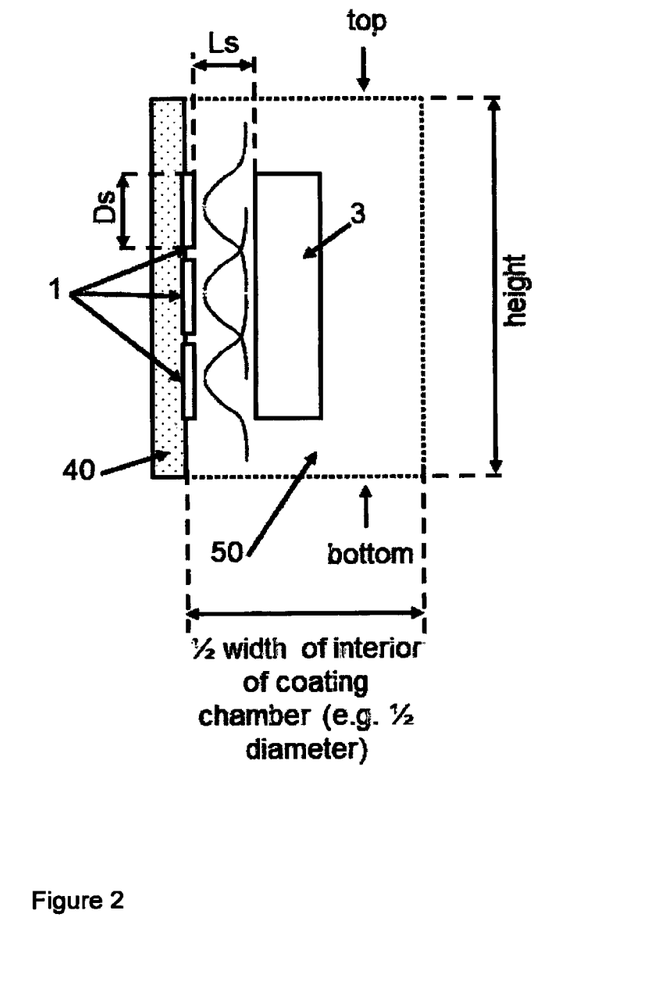
FIG. 2 shows another configuration of a coating chamber.

In order to better explain some of the above-mentioned aspects regarding increment of efficiency in the context of the present invention, FIG. 1 and FIG. 2 show two different configurations of coating chambers. In FIG. 1 two circular targets 1 having respectively diameter $D_b$ are placed in the coating chamber at a distance $L_b$ from a substrate 3 to be coated. In FIG. 2 three circular targets 1 having respectively diameter $D_s$ are placed in the chamber separated at a distance $L_s$ from a substrate 3 to be coated. FIG. 2 shows a coating configuration with denser packing of ARC sources because of a shorter distance cathode to cathode and even the possibility of using shorter distances cathode to substrate ($L_b$>$L_s$), which is in particular possible when also smaller targets diameters are used ($D_b$>$D_s$). It can be observed for example by looking and comparing the schematical drawings of the configurations shown in FIG. 1 and FIG. 2.

By Using the Above-Mentioned Embodiments of ARC Sources According to the Present Invention is Possible to Overcome the Drawbacks of the State of the Art and to Attain Following Advantages:

Managing "cross talk" between sources (with the term "cross talk" is meaning magnetic field cross talk, i.e. magnetic interference between two or more magnetic fields of two or more ARC sources)

Developing a new ARC source having new properties that can anyhow be compatible with available magnetic systems and with available ARC vaporization technologies.

Using targets with smaller diameter (in particular because of difficulties by designing an appropriate anode or anodes and by designing an appropriate magnet system for generating a magnetic field).

Figure 3A:
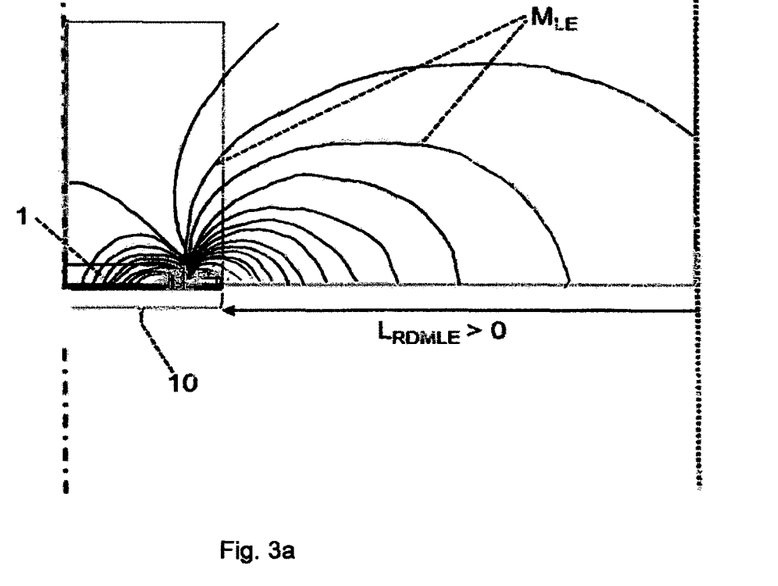
FIG. 3 shows a comparison between using an open magnetic loop according to the state of the art (FIG. 3a) and using a blocked magnetic field according to the present invention (FIG. 3b).
Figure 3B:
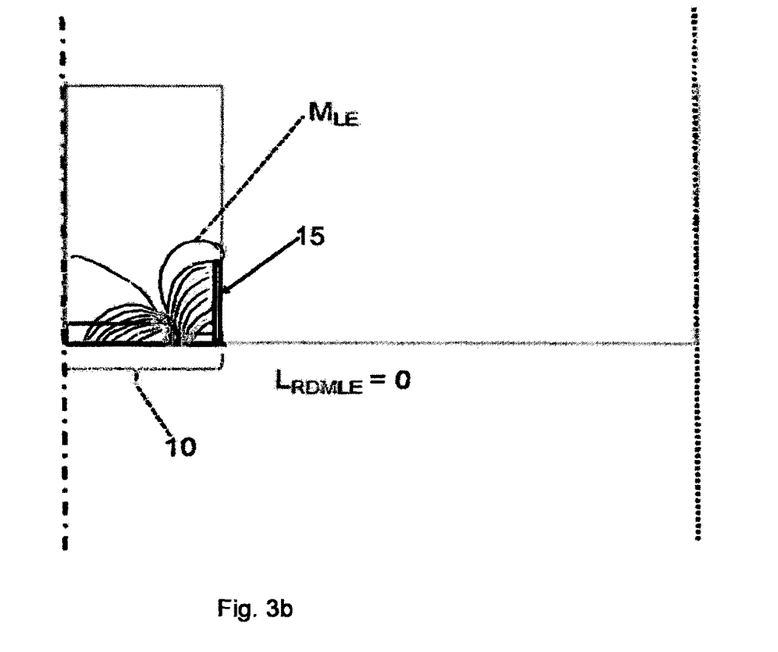

Further Description of Using a Surrounding Shield (in the Context of the Present Invention Also Referred to as Magnetic Shield Integrated in High Permeability Circuit):

The new ARC source according to the present invention enables implementing ARC sources arrangements (also referred to as cathode arrangements) exhibiting narrow source to source distances, by using a blocked magnetic field as it is shown in FIG. 3b.

As already explained above, the blocked magnetic field (hereafter also referred to as shunted magnetic loop) can be attained according to the present invention by providing the ARC source with a soft magnetic material shielding (also referred to as surrounding shield made of ferromagnetic material), for example a soft iron shielding or a low carbon steel shielding. In this manner it is possible that soft magnetic material shunting (e.g. soft iron shunting) of field generating means reduces magnetic interference by more than factor 10. By using inventive ARC sources combining a soft magnetic material shielding as mentioned above (in particular a soft iron shielding or a low carbon steel shielding surrounding the target) and circular targets having smaller diameter, it is possible to allow more dense packing of targets. This combination is also important for axisymmetric anode definition, in particular because in this manner, it is possible to use one or more annular anodes surrounding the circular target and having the same effect in all directions (in other words: symmetrically in all points forming the anode).

FIG. 3 shows a comparison between using an open magnetic loop according to the state of the art (see FIG. 3a) and using a blocked magnetic field according to the present invention (see FIG. 3b).

From this illustrative example, it is clear that using an open magnetic loop, as it is shown in FIG. 3a, it would result in interference with neighbor sources, if the neighbor sources are placed close to each other.

In other words, if a first ARC source is operated by using an open magnetic loop, some magnetic lines will extend along a distance in the radial direction beside the target 1 of the ARC source 10. These magnetic lines will be referred to as exterior magnetic lines, $M_{LE}$, in the context of the present invention and they are exemplarily shown in FIG. 3a. From this example, it is clear that if a neighbor source is placed at a radial distance comprised within the area being occupied with the exterior magnetic lines, $M_{LE}$, of another source, then it would result in an interference with the neighbor source.

In order to better explain the present invention, the radial distance beside an ARC source 10, along which exterior magnetic lines, $M_{LE}$, are extended will be referred to as radial distance comprising exterior magnetic lines and will be denoted as $L_{RDMLE}$, as it is indicated in FIG. 3.

According to the present invention a blocked magnetic field is used, as it is exemplarily shown in FIG. 3b. In this case no exterior magnetic lines, $M_{LE}$, can extend along a large distance in the radial direction beside the ARC source 10, consequently the radial distance comprising exterior magnetic lines is practically zero, $L_{RDMLE}=0$. In this manner it is possible to place two or more sources at a closer radial distance between each other without causing any interference with neighbor sources.

Figure 4:
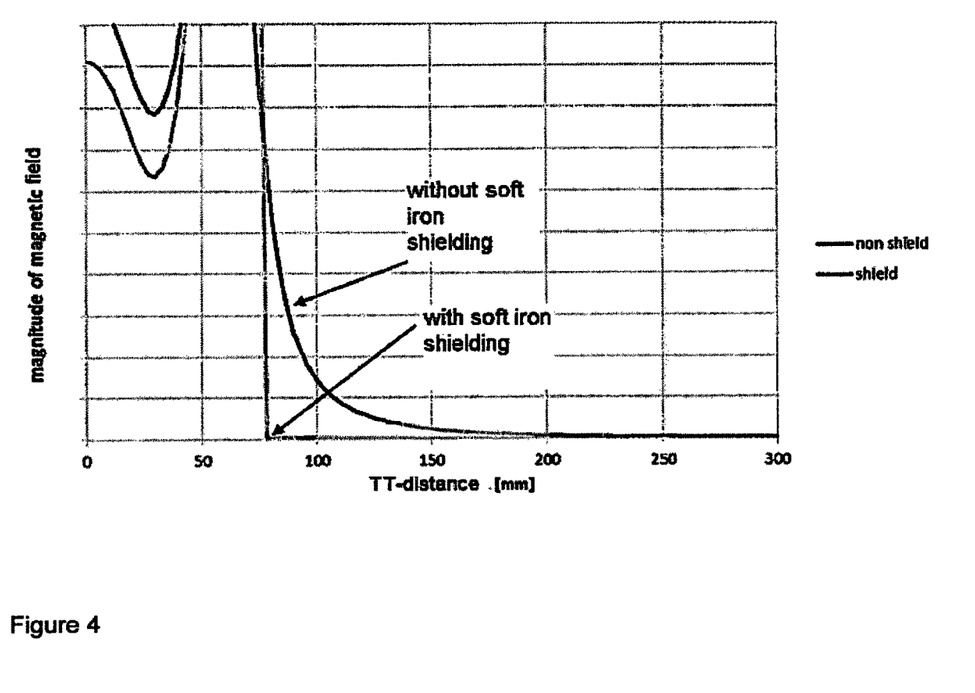
FIG. 4 shows a graph of magnetic field lines that were calculated taking into account the conditions generated by using two circular targets.

FIG. 4 shows a graphic of magnetic field lines that were calculated taking into account the conditions generated by using two circular targets, each target having a diameter of 100 mm and the targets being placed at a distance target to target of approximately 150 mm (hereafter the distance target to target will be also referred to as TT-distance—this distance is to be understood as the distance between two neighbor arranged one next to each other in the radial direction, wherein the distance is measured from the center point of one of the two neighbor targets to the center point of the another neighbor target in the radial direction).

In FIG. 4 it is possible to observe the difference in the distribution of the magnitude of magnetic field along the radial direction when ARC sources with open magnetic loop (without soft ion shielding) and inventive ARC sources with shunted magnetic loop (with soft iron shielding) are used. The magnitude of the magnetic field is negligible or completely canceled by effect of the soft iron shielding at a TT-distance lower than 150 mm, when the inventive ARC sources with shunted magnetic loop are used. Contrariwise, the magnitude of the magnetic field is only negligible at a TT-distance of at least 250 mm, when ARC sources with open magnetic loop are used.

The new ARC source according to the present invention can be also designed for allowing high flexibility regarding magnetic field configuration. It means in particular in the context of the present invention that the spatial distribution and field strength is designed so that it can be adjusted independently. In this manner it is possible to obtain a high flexibility regarding high scope of magnet adjustability for the magnetic field in axisymmetric configuration.

FIG. 5 shows different magnetic fields in axisymmetric configuration scope that can be adjusted with magnet configurations.

The present invention relates also to coating processes conducted by using ARC evaporators according to the present invention.

In Particular:

Coating process conducted by using an ARC evaporator according to any of the above-mentioned embodiments, wherein the ARC evaporator is operated by adjusting the three electromagnetic coils which constitute a coil system producing an oscillation of the magnetic field, thereby adjusting an oscillation frequency for guiding the arcs running at the front surface 1A of the target describing circular arc traces having different diameters.

Coating process as described directly above, wherein a circular target is used, which comprises a first material M1, forming the outer annular area of the target to be vaporized, and a second material M2, forming the inner area of the target to be vaporized.

Coating process as described directly above, wherein the target comprises two or more materials distributed in such a manner, that by changing the diameter of the circular arc being operated at the target surface, the target material that is being vaporized is changed.

Coating process as described directly above, wherein the at least two materials are aluminum and titanium.

Any of the coating processes described above, wherein the coating formed during operation of the ARC evaporator exhibit a multilayer structure, preferably a multi-nanolayer structure.

The invention claimed is:

1. An ARC evaporator comprising:
a cathode assembly comprising a cooling plate, a target as cathode element, the target having a thickness in a cross direction, a front surface disposed to be evaporated, and a back surface, the front surface being parallel to the back surface, the front surface and the back surface being separated from each other by a thickness of the target, the cathode assembly having a total height in a transversal direction and borders delimiting a total amplitude in a longitudinal direction, and the target defining a central region of the cathode assembly in the longitudinal direction, with a peripherical region of the cathode assembly extending beyond the target in the longitudinal direction,
an electrode arranged for enabling an arc to be established between the electrode and the front surface of the target for causing evaporation of at least part of the front surface of the target, and
a magnetic guidance system placed in front of the back surface of the target comprising means for generating one or more magnetic fields resulting in a total magnetic field comprising magnetic field lines which extend through a cross section of the target and along a space in front of the front surface of the target for guiding a cathode spot that results from contact of an arc to the target, when the arc is established between the electrode and the front surface of the target,
wherein the magnetic guidance system in the ARC evaporator comprises means placed in the central region for generating at least one magnetic field and means in the peripherical region for generating at least one further magnetic field, wherein the magnetic fields generated in this manner result in a total magnetic field for guiding the arc and controlling the cathode spot path at the front surface of the target, wherein the means placed in the central region comprises one electromagnetic coil for generating a magnetic field and the means placed in the peripherical region comprises two electromagnetic coils for generating two further magnetic fields.

2. An ARC evaporator according to claim 1, wherein the magnetic guidance system comprises ferromagnetic material disposed surrounding the means for generating the magnetic fields, wherein the ferromagnetic material is distributed encircling the means with no ferromagnetic material placed between the magnetic guidance system and the cathode assembly.

3. An ARC evaporator according to claim 1, wherein the magnetic guidance system comprises ferromagnetic material disposed surrounding the means for generating the magnetic fields, wherein the ferromagnetic material is distributed partially encircling the means with no ferromagnetic material placed between the magnetic guidance system and the cathode assembly, wherein an upper part with length (S) of the electromagnetic coil placed in the central region as well as an upper part with length (S') of the electromagnetic coil placed in the peripherical region but closest to the electromagnetic coil placed in the central region is not encircled by ferromagnetic material, resulting in a space comprising air, allowing in this manner that the total magnetic field that results from a sum of the generated magnetic fields exhibits more magnetic field lines that are parallel to the front surface of the target in comparison with a similar arc evaporator without having said space comprising air.

4. An ARC evaporator according to claim 3, wherein the upper length (S) is in the following range: 3 mm≤S≥15 mm, a target diameter (D1) is in the following range: 100 mm≤D1≥150 mm and a total diameter (D) of the cathode assembly is in the following range: 150 mm≤D≥200 mm.

5. An ARC evaporator according to claim 4, wherein the borders of the cathode assembly comprise a surrounding shield made of ferromagnetic material, wherein the surrounding shield has a total height in the transversal direction, said total height including a component (C) for causing a shielding effect of magnetic field lines extending in any longitudinal direction, establishing in this manner the borders of the cathode assembly as a limit of the extension of the magnetic field lines in any longitudinal direction.

6. An ARC evaporator according to claim 5, wherein the cathode assembly has a symmetrical construction comprising a disc-shaped target with a target diameter (D1) and the cathode assembly has a total diameter (D), wherein the component (C) has a value in the following range: D/20≤C≥D/5.

7. An ARC evaporator according to claim 4, wherein the target diameter is in the following range: 100 mm≤D1≥150 mm and the total diameter of the cathode assembly is in the following range: 150 mm≤D≥200 mm.

8. An ARC evaporator according to claim 2, wherein the ferromagnetic material is pure iron or ARMCO pure iron or construction steel or martensitic chromium steel.

9. An ARC evaporator according to claim 8, wherein the ferromagnetic material is construction steel S355J2.

10. A coating process conducted by using an ARC evaporator according to claim 1, comprising operating the ARC evaporator by adjusting the three electromagnetic coils which constitute a coil system producing an oscillation of the magnetic field, thereby adjusting an oscillation frequency for guiding the arcs running at the front surface of the target describing circular arc traces having different diameters.

11. The coating process according to claim 10, comprising using a circular target, which comprises a first material, forming an outer annular area of the target to be vaporized, and a second material, forming an inner area of the target to be vaporized.

12. The coating process according to claim 11, wherein the target comprises two or more materials distributed in such a manner, that by changing the diameter of the circular arc being operated at the target surface, the target material that is being vaporized is changed.

13. The coating process according to claim 12, wherein the at least two materials are aluminum and titanium.

14. The coating process according to claim 11, wherein a coating formed during operation of the ARC evaporator exhibits a multilayer structure.

15. The coating process according to claim 10, wherein the oscillation frequency is adjusted to be in a range between 0.1 Hz and 50 Hz.

* * * * *